US006445514B1

(12) United States Patent
Ohnstein et al.

(10) Patent No.: US 6,445,514 B1
(45) Date of Patent: Sep. 3, 2002

(54) MICRO-POSITIONING OPTICAL ELEMENT

(75) Inventors: Thomas Raymond Ohnstein, Roseville; Klein Leonard Johnson, St. Paul, both of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/689,967

(22) Filed: Oct. 12, 2000

(51) Int. Cl.[7] .................................................. G02B 7/02

(52) U.S. Cl. ...................................... 359/813; 359/824

(58) Field of Search ............................... 359/814, 822, 359/823, 824, 813

(56) References Cited

U.S. PATENT DOCUMENTS

| 4,805,543 | A | * | 2/1989 | Schwab et al. | ............... 108/20 |
| 4,818,263 | A | | 4/1989 | Mitch | .............................. 65/2 |
| 4,932,989 | A | | 6/1990 | Presby | ............................ 65/2 |
| 5,717,631 | A | | 2/1998 | Carley et al. | ............... 365/174 |
| 5,839,807 | A | | 11/1998 | Perlo | ............................ 353/38 |
| 5,970,315 | A | | 10/1999 | Carley et al. | ................. 438/52 |

(List continued on next page.)

OTHER PUBLICATIONS

Toshiyoshi et al. Proc. 3rd int'l conf. on micro opto electro mechanical system (MOEMS 99), Aug. 30–Sep. 1, 1999, Maintz Germany, pp. 165–170.*
Hiroshi Toshiyoshi et al., "Surface micromachined 2D Lens Scanner Array", *Proc. IEEE?LEOS International Coference on Optical EMMS/Sheraton Kauai Resort*, Kauai, Hawaii, Aug. 21–24, 2000, 2 pages.

Hiroshi Toshiyoshi et al., "Micromechanical Lens Scanner for Fiber Optic Switches", *Proc. 3$^{rd}$ International Conference on Micro Opto Electro Mechanical Systems (MOEMS 99)*, Aug. 30–Sep. 1, 1999, Mainz, Germany, pp. 165–170.
Adisorn Tuantranont et al., "Flip Chip Integration of Lenslet Arrays on Segmented Deformable Micromirrors", *Part of the Symposium on Design, Test and Microfabrication of MEMS and MOEMS*, Paris, France, Mar.–Apr. 1999, SPIE vol. 3680, 0277–786X/99, pp. 668–678.
Adisorn Tuantranont et al., "MEMS–Controllable Microlens Array For Beam Steering and Precision Alignment in Optical Interconnect Systems", *Solid–State Sensor and Actuator Workshop*, Hilton Head Island, South Carolina, Jun. 4–8, 2000, pp. 101–104.
G. K. Fedder et al., "Laminated High–Aspect–Ratio Microstructures in a Conventional CMOS Process", *Proc. Micro Electro Mechanical Systems Workshop*, MEMS 96, San Diego, California, Feb. 11–15, 1996, pp. 13–18.

*Primary Examiner*—Georgia Epps
*Assistant Examiner*—Saeed Seyrafi
(74) *Attorney, Agent, or Firm*—Andrew A. Abeyta; John C. Shudy, Jr.; Brian N. Tufte

(57) ABSTRACT

A micro-positioning system for accurately positioning an optical element relative to an optical device such as a laser diode, Vertical Cavity Surface Emitting Laser (VCSEL), Resonant Cavity Photo Detector (RCPD), or some other type of optical device. The micro-positioning system is adapted to move the optical element independently in both the X and Y directions. The optical element preferably has at least two regions where the optical characteristics are different. In operation, the optical element is selectively moved so that a light beam intersects a selected region of the optical element. Because the optical characteristics of the optical element are different in different regions, the optical element produces a different optical result as the light beam is moved between regions. This may be useful in a number of applications including, for example, optical alignment, optical switching including Space Division Multiplexing (SDM), Wavelength Division Multiplexing (WDM), and Polarization Division Multiplexing (PDM).

44 Claims, 9 Drawing Sheets

U.S. PATENT DOCUMENTS

| | | | |
|---|---|---|---|
| 6,054,335 A | 4/2000 | Sun et al. | 438/23 |
| 6,091,197 A | 7/2000 | Sun et al. | 313/509 |
| 6,091,537 A * | 7/2000 | Sun et al. | 359/248 |
| 6,094,293 A | 7/2000 | Yokoyama et al. | 359/280 |
| 6,097,859 A | 8/2000 | Solgaard et al. | 385/17 |
| 6,116,756 A | 9/2000 | Peeters et al. | 362/285 |
| 6,124,663 A | 9/2000 | Haake et al. | 310/307 |
| 6,295,171 B1 * | 9/2001 | Chao et al. | 359/813 |

* cited by examiner

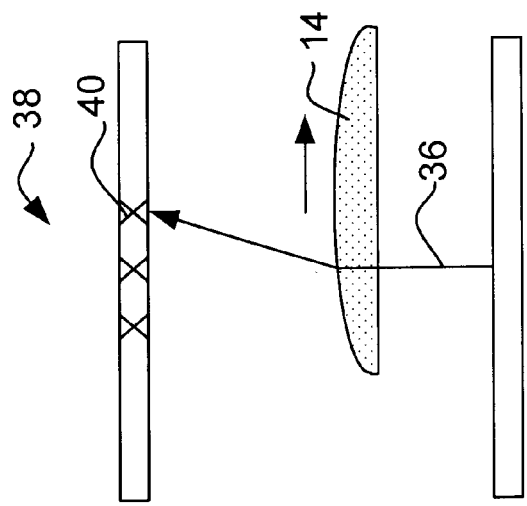
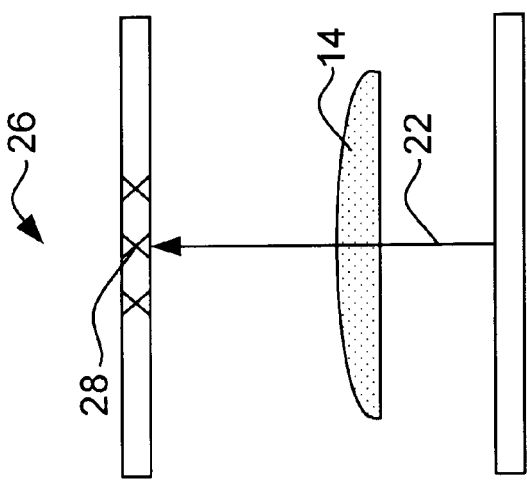
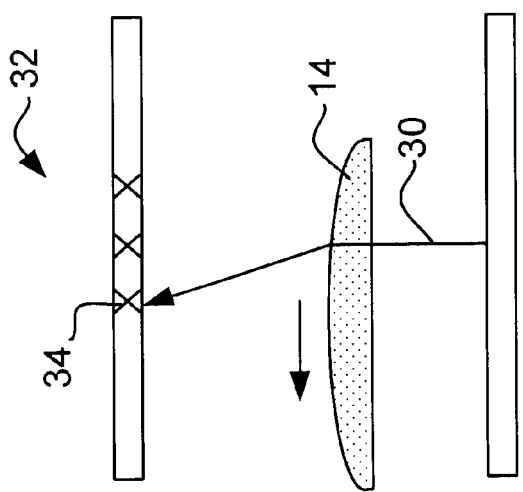
FIG. 2

MICRO-POSITIONING OPTICAL ELEMENT

FIELD OF THE INVENTION

The present invention generally relates to optical systems, and more particularly to micro-positioning optical systems that have an optical element that can be moved or positioned relative to an optical source or receiver.

BACKGROUND OF THE INVENTION

It is desirable in many applications to precisely align or micro-position various objects. Although the precision with which the objects must be positioned varies according to the application, the objects must often be aligned to within several microns to several tenths of microns. One typical application that can benefit from micro-positioning relates to the alignment of an optical fiber, such as a single mode optical fiber, with another electro-optical element, such as a laser diode or Vertical Cavity Surface Emitting Laser (VCSEL). By appropriately micro-positioning the electro-optical device with the optical fiber, a large percentage of the optical signal can be coupled to the respective optical fiber.

Although several micro-positioning devices have been proposed for fiber optic connector applications, a need still exists for fiber optic alignment devices that incorporate improved micro-positioning techniques. For example, increased demands are being made upon the precision with which objects, such as optical fibers, are aligned. As such, there is a need for more precise alignment devices that provide reliable and repeatable micro-positioning to within a few microns to several tenths of microns.

Another application that can benefit from micro-positioning is optical switching. Recent developments in information networks have provided an increased demand for optical communication systems capable of transmitting a great deal of data. In one example, free-space optical interconnection is now being used to make relatively short but fast interconnections within data processing or communications systems. Some of the advantages of free-space interconnects include direct interconnects between circuit boards, arbitrary interconnection patterns, multiple fan-outs, channel isolation and increased bandwidth.

Optical switches typically switch, or redirect, light from for example, an electro-optical device such as a VCSEL to one of several optical receivers. The optical receivers can be optical fibers, Resonant Cavity Photo Detectors (RCPD's), or any other type of optical receiver. Some optical switches use lens decentering to steer the light beam as desired. See, for example, "MEMS-Controlled Microlens Array For Beam Steering and Precision Alignment in Optical Interconnect Systems", Tuantranont et al., Solid-State Sensor and Actuator Workshop, Hilton Head Island, S.C., Jun. 4–8, 2000(pp. 101–104).

Yet another application that can benefit from micro-positioning is optical scanning devices used to read and/or write CDs or the like. Micro-positioning can be used to improve the alignment of the optical scanning devices relative to the tracks of the CD. All of the above applications and others could benefit from an improved micro-positioning system.

SUMMARY OF THE INVENTION

The present invention provides an improved micro-positioning system that can accurately position an optical element relative to an optical device such as a laser diode, a Vertical Cavity Surface Emitting Laser (VCSEL), a Resonant Cavity Photo Detector (RCPD), or other type of optical device. The optical element may be any type of optical element including, for example, a lens, a filter such as a diffraction grating, or other type of optical element.

In one illustrative embodiment, a micro-positioning system is provided that selectively moves the optical element independently in both the X and Y directions relative to a base. The base is preferably fixed relative to an optical device, such as a VCSEL, RCPD or photo diode. Thus, in one embodiment, the optical element can be independently moved in both the X and Y directions relative to the optical device.

Independent movement of the optical element is preferably provided by a carrier that is spaced above the base. The carrier is operatively coupled to the base such that the carrier can be selectively moved in the X direction but not substantially in the Y direction. The optical element is then preferably operatively coupled to the carrier such that the optical element can be selectively moved in the Y direction relative to the carrier, but not substantially in the X direction. An X driver is then used to selectively move the carrier in the X direction relative to the base, and a Y driver is used to selectively move the optical element in the Y direction relative to the carrier. The carrier can thus be used to provide independent movement of the optical element in both the X and Y directions relative to the base.

Preferably, the X driver and the Y driver provide movement by means of an electrostatic force. In one embodiment, the X driver includes a number of inter-digitated comb fingers. Some of the comb fingers are mechanically coupled to the carrier while others are mechanically coupled to the base. By providing a voltage difference between the comb fingers, the X driver can "pull" the carrier in one direction (e.g., left) relative to the base. Another set of comb fingers may be provided on the opposite side of the carrier to "pull" the carrier in the opposite direction (e.g., right), if desired. Likewise, the Y driver may include a number of inter-digitated comb fingers. Some of the comb fingers are mechanically coupled to the carrier while others are mechanically coupled to the optical element. By providing a voltage difference between the comb fingers, the Y driver can "pull" the optical element in one direction (e.g., up) relative to the carrier. Another set of comb fingers may be provided on the opposite side of the carrier to "pull" the optical element in the opposite direction (e.g., down), if desired.

The optical element may be any type of optical element, such as a lens, an optical filter such as a diffraction grating, an optical polarizer, or any other type of optical element. The optical element preferably has at least two regions where the optical characteristics are different in the at least two regions. In one example, the optical element may be a lens. The optical characteristics of a lens typically vary across the lens. Thus, a light beam that intersects the lens at a first location will be refracted at a different angle than a light beam that intersects the lens at a second location. In another example, the optical element may include a diffraction grating that has a grating spacing and a grating width. The grating spacing and/or grating width may be different in different regions of the optical element. Alternatively, or in addition, the angle of the diffraction grating may be different in different regions of the optical element.

In operation, the optical element may be selectively moved so that a light beam intersects a selected region of the optical element. Because the optical characteristics of the optical element are different in different regions, the optical element produces different optical results as the light beam is moved between regions. For example, when the optical element is a lens, the light beam is refracted at different angles and thus to different locations as the lens is moved relative to the light beam. This is sometimes referred to as beam steering. Beam steering can be useful in a number of applications, including optical alignment, optical switching including Space Division Multiplexing (SDM), and other applications.

In another example, when the optical element includes a diffraction grating with regions having different grating spacing and/or different grating widths, the light beam may be selectively separated or filtered according to wavelength. This may be useful in providing, for example, Wavelength Division Multiplexing (WDM) or the like. Likewise, when the angle of the diffraction grating is varied in different regions of the optical element, the polarization of the light beam may be controlled. This can be useful in providing Polarization Division Multiplexing (PDM).

BRIEF DESCRIPTION OF THE DRAWING

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 2 is a schematic diagram showing the concept of beam steering, which in the embodiment shown, is accomplished by moving a lens relative to a fixed light beam;

DETAILED DESCRIPTION OF THE PREFERRED EMBODIMENTS

Figure 1:
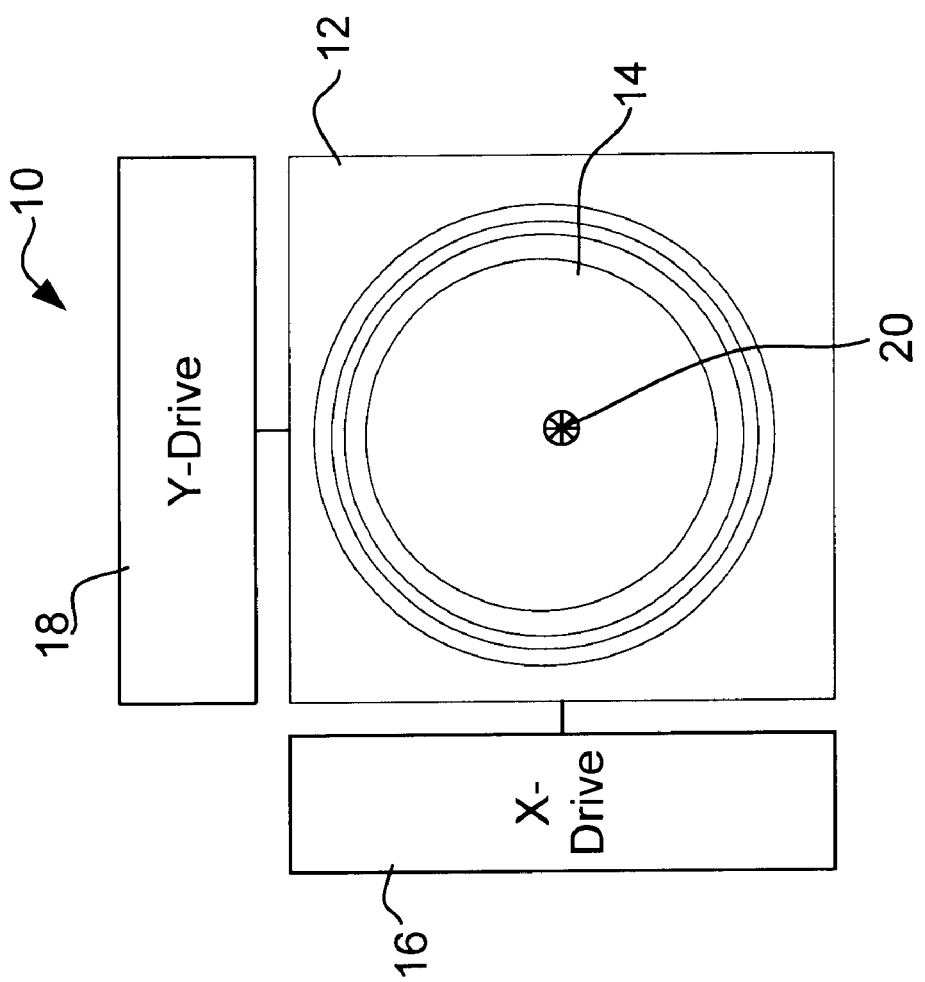
FIG. 1 is a schematic view of a micro-positioning system in accordance with the present invention that can accurately position an optical element relative to an optical device independently in both the X and Y directions.

FIG. 1 is a schematic view of a micro-positioning system in accordance with the present invention that can independently position an optical element relative to an optical device in both the X and Y directions. The micro-positioning system is generally shown at 10, and includes an optical element 12, a X Driver 16, and a Y driver 18. The illustrative optical element 12 includes a refractive lens 14. The lens 14 is positioned generally above the optical device 20. The optical device 20 may be an optical source such as a VCSEL, laser diode or the like, or an optical receiver such as an RCPD, photo diode, optical fiber, or the like. The micro-positioning device 10 can be made in arrays of micro-positioners coupled to arrays of optical devices 20, if desired. In an event, a light beam preferably extends through the lens 14.

The X Drive 16 selectively moves the optical element 14 in the X direction relative to the optical device 20. The Y Drive 18 selectively moves the optical element 14 in the Y direction relative to the optical device 20. Preferably, the X Drive 16 can move the optical element 14 independently of the Y Drive 18, and the Y Drive 18 can move the optical element 14 independently of the X Drive 16.

It is contemplated that the optical element 14 may be any type of optical element, such as a lens 14, an optical filter such as a diffraction grating, an optical polarizer, or any other type of optical element. The optical element preferably has at least two regions, wherein the optical characteristics are different in the at least two regions. During operation, the optical element is preferably selectively moved so that the light beam intersects a selected region of the optical element. Because the optical characteristics are different in different regions, the optical element will produce different optical results as the light beam is moved between different regions.

For example, when the optical element is a refractive lens 14 as shown in FIGS. 1 and 2, the optical characteristics of the lens 14 will vary monotonically across the lens 14. Thus, and as shown in FIG. 2, a light beam that intersects the lens 14 will be refracted at different angles depending on the location of the light beam relative to the lens 14. When a light beam 22 intersects the center of the lens 14, as shown at 26, the light beam 22 is not refracted at all and travels to a center optical destination 28. When a light beam 30 intersects a point to the right of the center of the lens 14, as shown at 32, the light beam 30 is refracted to the left and travels to a left optical destination 34. Finally, when a light beam 36 intersects a point to the left of the center of the lens 14, as shown at 38, the light beam 36 is refracted to the right and travels to a right optical destination 40. This is sometimes referred to as beam steering. Beam steering can be useful in a number of applications, including optical alignment, optical switching including Space Division Multiplexing (SDM), and other applications.

Figure 3:
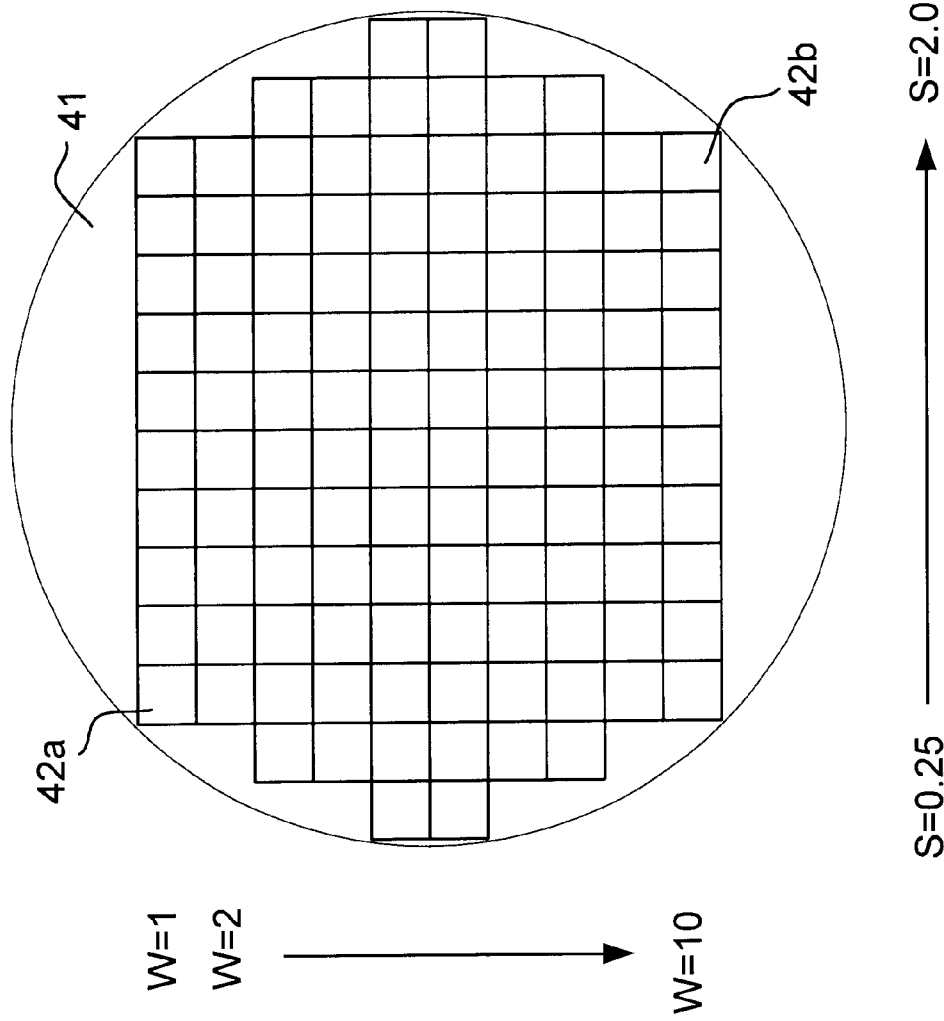
FIG. 3 is a schematic diagram of an optical element that includes a diffraction grating with regions that have different grating spacings and/or different grating widths.

In another example, the optical element 14 may include a diffraction grating that has a grating spacing and a grating width. The grating spacing and/or grating width may be different in different regions of the optical element 14. FIG. 3 is a schematic diagram of an optical element 41 that includes a diffraction grating with regions 42a and 42b having different grating spacings and/or different grating widths. In the illustrative embodiment, region 42a has a grating spacing of 0.25 microns and a grating width of 1 micron, as indicated by the scales below and to the left of the optical element 41. In contrast, region 42b has a grating spacing of 2.0 microns and a grating width of 10 microns. The illustrative optical element has one hundred and sixteen (116) different regions, each with a different grating spacing and grating width combination.

During operation, the optical element 41 is preferably selectively moved relative to a light beam so that the light beam intersects a selected region of the optical element. Because each of the regions have a different grating spacing and/or grating width, the light beam may be selectively separated or filtered according to wavelength. This may be useful in providing, for example, Wavelength Division Multiplexing (WDM) or the like.

Figure 4:
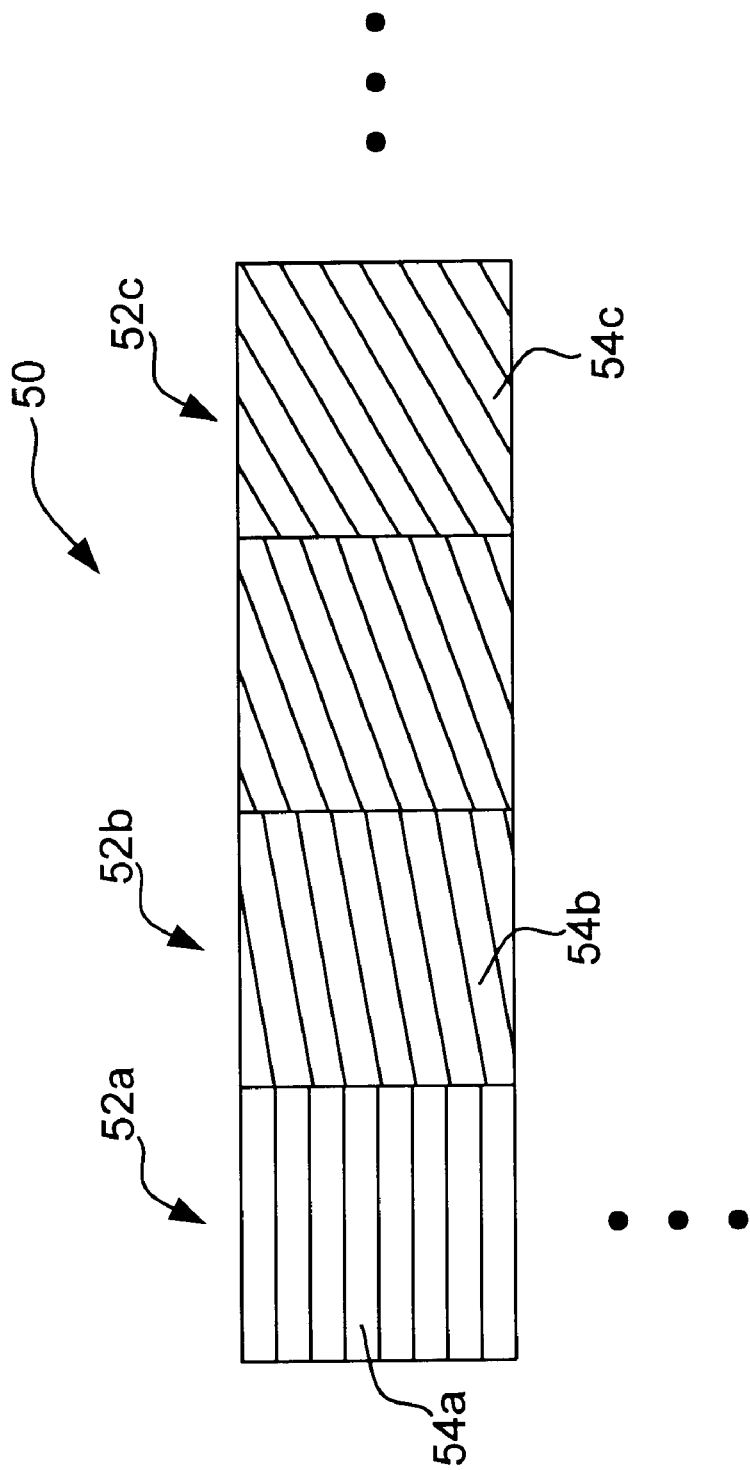
FIG. 4 is schematic diagram of an optical element that includes a diffraction grating with regions that have different grating angles.

In another illustrative embodiment, it is contemplated that each region may have a grating that extends at a different angle. FIG. 4 is schematic diagram of an optical element 50 that includes a diffraction grating with regions having different grating angles. In region 52a, the diffraction grating 54a extends parallel (zero degrees) to a horizontal extending axis. The diffraction grating 54b of region 52b is offset about ten (10) degrees relative to the horizontal extending axis. The diffraction grating 54c of region 52c is offset about ten (30) degrees relative to the horizontal extending axis. It is contemplated that any number of regions may be provided, each having a grating that offsets at a different angle. By varying the angle of the diffraction grating in different regions of the optical element 50, the polarization of the light that is transmitted through the optical element 50 may be controlled. This can be useful in providing, for example, Polarization Division Multiplexing (PDM).

Figure 5:
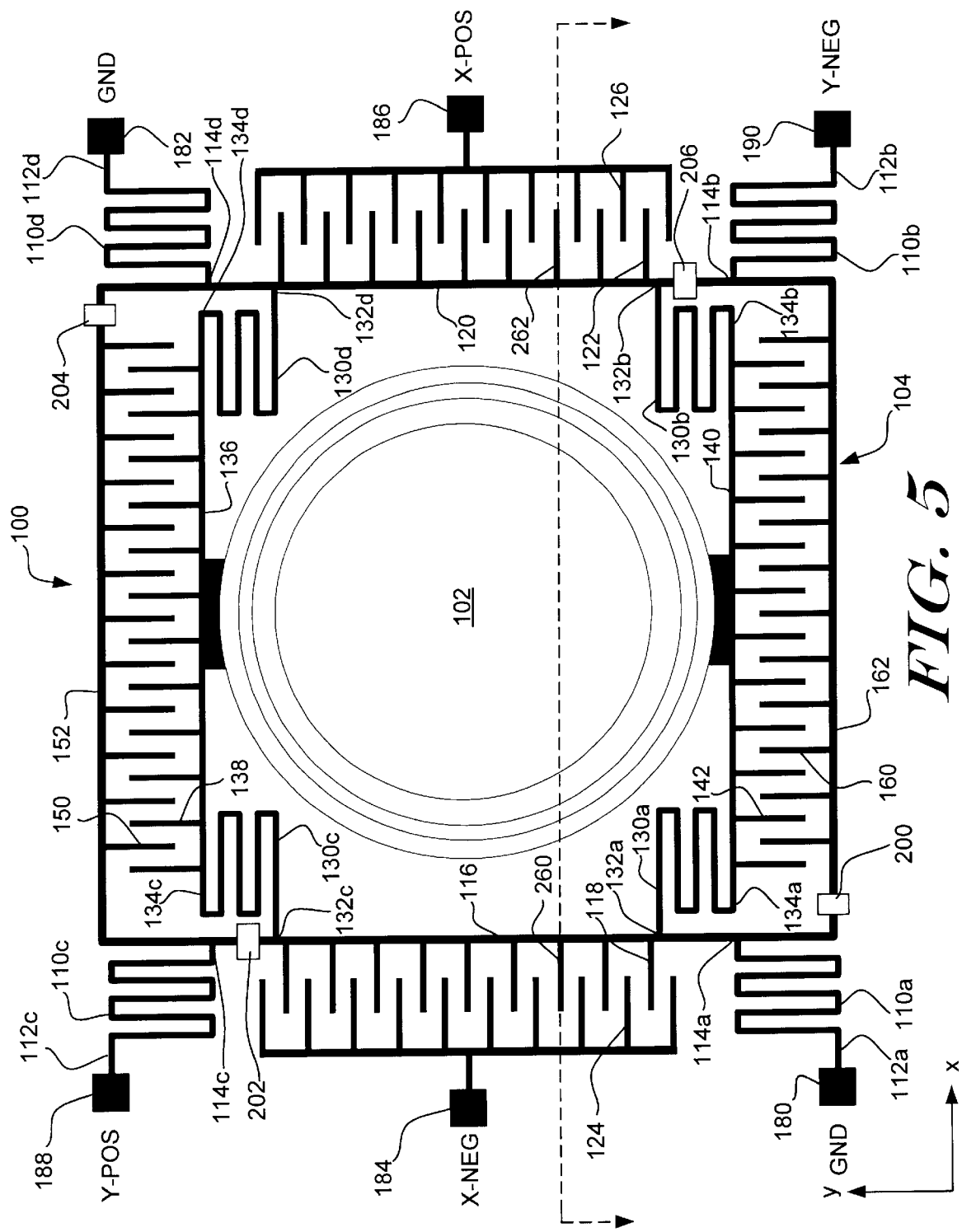
FIG. 5 is a schematic diagram of a preferred micro-positioning system that provides independent control of an optical device in both the X and Y directions.

FIG. 5 is a schematic diagram of a preferred micro-positioning system 100 that provides independent control of an optical device 102 in both the X and Y direction. Independent movement of the optical element is achieved by providing a carrier or frame 104 that is spaced above a base 106 (see FIG. 6). The carrier 104 is operatively coupled to the base 106 such that the carrier 104 can be selectively moved in the X direction but not substantially in the Y direction. This is preferably accomplished by coupling the carrier 104 to the base 106 with, for example, four (4) folded beam or serpentine springs 110a–110d. One end (e.g., 112a–112d) of each serpentine spring 110a–110d is anchored to the base 106, and the other end (e.g., 114a–114d) is anchored to the carrier 104. The serpentine springs 110a–110d are preferably designed such that they substantially prevent movement of the carrier 104 out of the plane of the structure and substantially prevent movement in the in-plane Y direction. Thus, the carrier 104 is only allowed to move laterally along the X direction.

The left side 116 of the carrier 104 includes a number of comb fingers, such as comb finger 118, that extend to the left. Likewise, the right side 120 of the carrier 104 includes a number of comb fingers, such as comb finger 122, that extend to the right. Each of the comb fingers 118 and 122 are fixed to the carrier 104, and preferably are integrally formed with the carrier 104.

Extending from the left, a number of comb fingers, such as comb finger 124, extend to the right and are inter-digitated with the left comb fingers 118 of the carrier 104. Likewise, extending from the right, a number of comb fingers, such as comb finger 126, extend to the left and are inter-digitated with the right comb fingers 122 of the carrier 104. Preferably, the comb fingers 124 and 126 are fixed to the base 106.

To move the carrier 104 to the left, an X driver provides a voltage difference between the static comb fingers 124 and the left comb fingers 118. Since comb fingers 118 are attached to the carrier 104, the electrostatic actuation causes the carrier 118 to move to a new leftward position relative to the base. Likewise, to move the carrier 104 to the right, the X driver provides a voltage difference between the static comb fingers 126 and the right comb fingers 122. Since comb fingers 122 are attached to the carrier 104, the electrostatic actuation causes the carrier 118 to move to a new rightward position relative to the base. To a first order, the position of the carrier 104 is proportional to the force, which is proportional to the square of the applied voltage.

An optical element, such as lens 102, is preferably operatively coupled to the carrier 104 such that the optical element 102 can be selectively moved in the Y direction relative to the carrier 104, but not substantially in the X direction. This is preferably accomplished by coupling the optical element 102 to the carrier 104 using, for example, four (4) serpentine springs 130a–130d. One end (e.g., 132a–132d) of each serpentine spring 130a–130d is anchored to the carrier 104, and the other end (e.g., 134a–134d) is anchored to the optical element 102, as shown. The serpentine springs 130a–130d are preferably designed such that they substantially prevent movement of the optical element 102 out of the plane of the structure and also substantially prevent movement in the in-plane X direction. Thus, the optical element 102 is only allowed to move along the Y direction relative to the carrier 104.

In the illustrative embodiment, the optical element includes a top support bridge 136 that extends between the top serpentine springs 130a and 130b, and a bottom support bridge 140 that extends between the bottom serpentine springs 130c and 130d. The top support bridge 136 of the optical element includes a number of comb fingers, such as comb finger 138, that extend upward. Likewise, the bottom support bridge 140 of the optical element 102 includes a number of comb fingers, such as comb finger 142, that extend downward. Each of the comb fingers 138 and 142 are fixed to the corresponding support bridge, and are preferably integrally formed therewith.

A number of comb fingers, such as comb finger 150, extend down from the top 152 of the carrier 104 and are inter-digitated with the comb fingers 138 that extend upward from the top support member 136 of the optical element. Likewise, a number of comb fingers, such as comb finger 160, extend up from the bottom 162 of the carrier 104 and are inter-digitated with the comb fingers 142 that extend downward from the bottom support member 140 of the optical element.

To move the optical element 102 in an upward direction, a Y driver provides a voltage difference between the comb fingers 150 that extend down from the top 152 of the carrier 104 and the comb fingers 138 that extend up from the top support member 136 of the optical element. The electrostatic actuation causes the optical element 102 to move to a new upward position relative to the carrier 104. Likewise, to move the optical element 102 in an downward direction, the Y driver provides a voltage difference between the comb fingers 160 that extend up from the bottom 162 of the carrier 104 and the comb fingers 142 that extend down from the bottom support member 140 of the optical element. The electrostatic actuation causes the optical element 102 to move to a new downward position relative to the carrier 104. To a first order, the position of the optical element 102 relative to the carrier 104 is proportional to the force, which is proportional to the square of the applied voltage.

Preferably, the carrier 104, serpentine springs 110a–110d and 130a–130d, comb fingers 118, 122, 124, 126, 138, 142, 150 and 160, and top and bottom support bridges 136 and 140 are all patterned from a single doped silicon layer. To help deliver an appropriate voltage to the various elements of the micro-positioning system 100, metal traces are preferably provided on top of the silicon layer to the connecting terminals of the micro-positioning system, 180 to 190. These metal traces are electrically isolated from the silicon layer by providing a dielectric layer between the silicon layer and the metal traces.

In one illustrative embodiment, metal traces connect to the silicon layer at the ground terminals 180 and 182. This effectively connects to ground, various parts of the micro-positioning system, through the silicon layer, from the ground terminal 180, along serpentine spring 110*a*, up the left side 116 of carrier 104, along serpentine springs 130*a* and 130*c*, then down the top and bottom support bridges 136 and 140, along serpentine springs 130*b* and 130*d*, and down the right side 120 of the carrier 104. The connection also continues across serpentine spring 110*d* to ground terminal 182. Another metal trace may electrically connect to the silicon layer at the X-NEG terminal 184 and to comb fingers 124 through the silicon layer. Yet another metal trace may electrically connect to the silicon layer at the X-POS terminal 186 and to comb fingers 126 through the silicon layer. Another metal trace may connect to the silicon layer at the Y-POS terminal 188, and connect with serpentine spring 110*c*, down the top 152 of the carrier 104, and finally to comb fingers 150, through the silicon layer. Finally, another metal trace may connect to the silicon layer at the Y-NEG terminal 190, and connect with serpentine spring 110*b*, down the bottom 162 of the carrier 104, and finally to comb fingers 160, through the silicon layer.

To provide electrical isolation between the various parts of the micro-positioning structure, a number of isolation members may be provided. For example, an isolation member 200 may be used to electrically isolate the bottom 162 of the carrier 104 from the left side 116 of the carrier 104. Likewise, an isolation member 202 may be used to electrically isolate the left side 116 of the carrier 104 from the top 152 of the carrier 104. Yet another isolation member 204 may be used to electrically isolate the top side 152 of the carrier 104 from the right side 120 of the carrier 104. Finally, an isolation member 206 may be used to electrically isolate the right side 120 of the carrier 104 from the bottom 156 of the carrier 104. It is recognized that the connecting terminals 180–190 and the various exterior combs 124 and 126 must be isolated from one another, particularly if they are all formed using the same top silicon layer. Such isolation can be accomplished in any number of ways including, for example, using trench isolation techniques.

Figure 6:
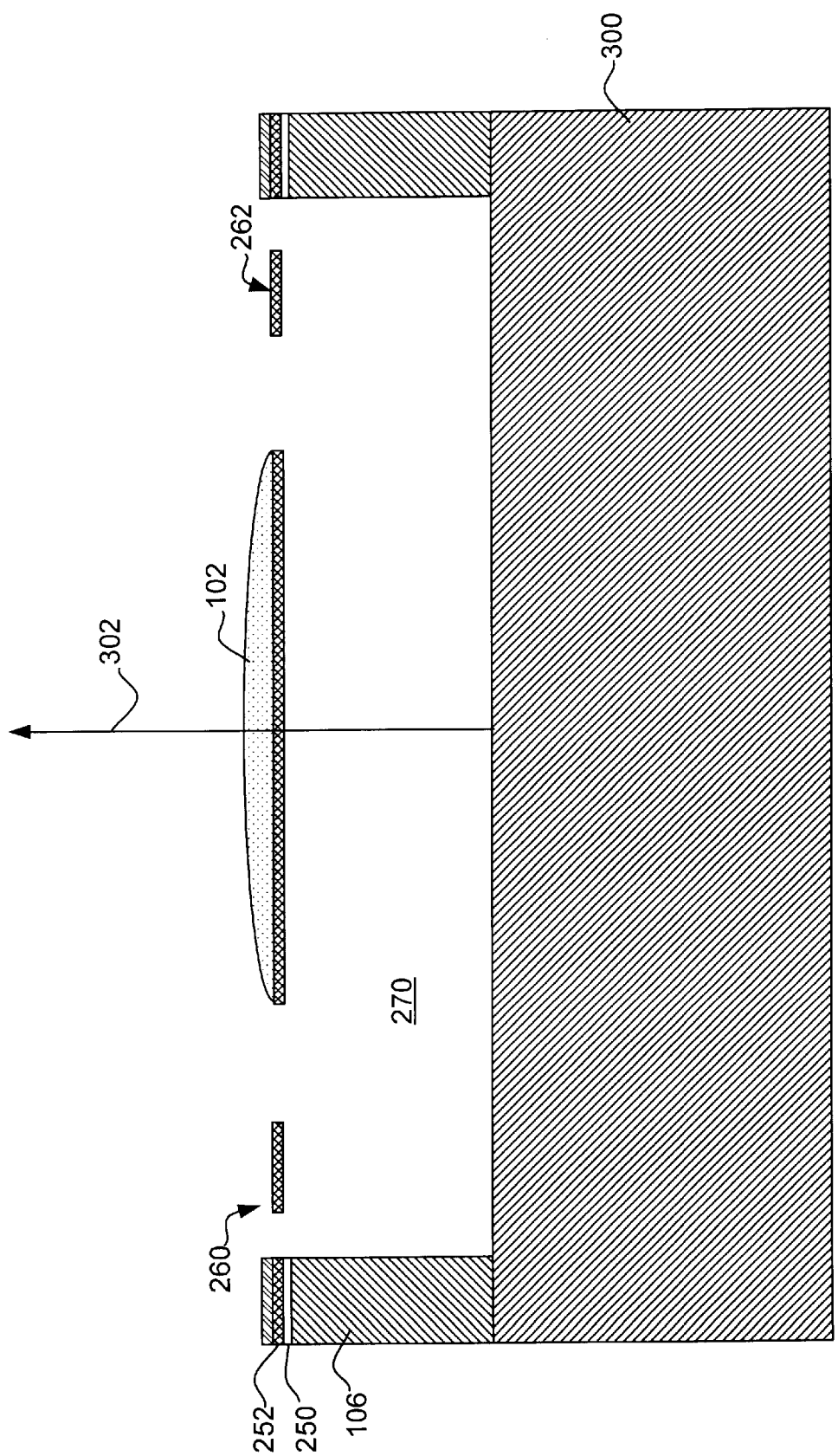
FIG. 6 is an illustrative cross-sectional view of the micro-positioning system of FIG. 5 taken along line 6—6.

FIG. 6 is an illustrative cross-sectional view of the micro-positioning system of FIG. 5 taken along line 6—6. The micro-positioning system is preferably formed using an SOI type wafer. The SOI wafer preferably has a silicon substrate or base 106, a thin oxide layer 250, topped with a top silicon layer 252. The serpentine springs 110*a*–110*d*, carrier 104, serpentine springs 130*a*–130*d*, top and bottom support bridges 136 and 140, and in some cases the optical element 102 are formed from the top silicon layer 252. The top silicon layer 252 is preferably doped sufficiently n-type to be conductive. Arrays of the micro-positioning system device could also be made together in the same substrate.

In FIG. 6, the optical element 102 is shown as a lens. The lens is preferably formed from a material that delivers the desired optical characteristics at the desired wavelength. Example materials include silicon, polysilicon, and silica. As can be seen from FIG. 6, comb finger 260, optical element 102 and comb finger 262 are suspended above an open space 270. In the illustrative embodiment, comb fingers 260 and 262 are both electrically connected through the silicon layer to ground terminals 180 and 182, as described above with respect to FIG. 5.

In a preferred embodiment, the substrate or base 106 is fixed to substrate 300 using anodic bonding, adhesive bonding, solder bonding, flip chip solder bonding, or any other suitable means. Substrate 300 preferably has an optical device therein. Substrate 300 could have an array of optical devices formed therein which could be made to align with an array of the micro-positioners. As indicated above, the optical device may be any type of optical device including a VCSEL, RCPD, laser diode, etc. The optical device may provide or receive a light beam 302 through the optical element 102. The micro-positioning system may then be used to move the optical element 102 relative to the light beam 302 to perform beam steering or the like.

Figure 7:
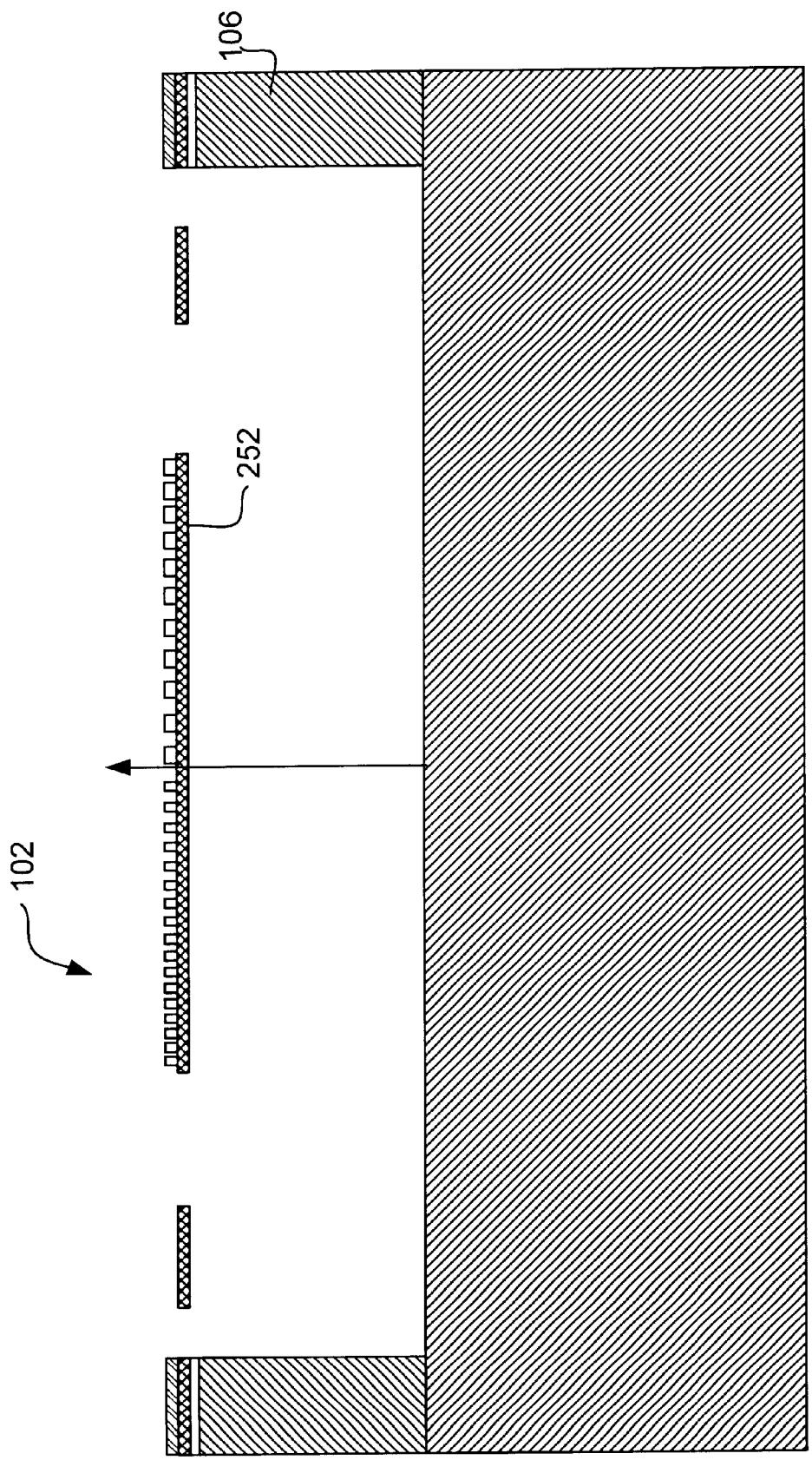
FIG. 7 is another illustrative cross-sectional view of the micro-positioning system of FIG. 5 taken along line 6—6.

FIG. 7 is another illustrative cross-sectional view of the micro-positioning system of FIG. 5 taken along line 6—6. In this embodiment, the optical element 102 includes a diffracting grating. The characteristics of the diffraction grating preferably change in various regions of the optical element 102, as shown at 102. The diffraction grating can be formed by adding a grating on top of top silicon layer 252, or alternatively may be formed by etching channels in the top surface of the top silicon layer 252 (not shown). Other methods for forming a diffraction grating are also contemplated.

FIGS. 8A–8E show an illustrative method for fabricating a micro-positioning system of the present invention. In the illustrative embodiment, the starting material is an SOI silicon wafer, generally shown at 350. The SOI wafer 350 has a silicon substrate or base 106, and a thin oxide layer 250 topped with a top silicon layer 252.

Isolation members 200–206 (see FIG. 5) are preferably formed first. This may be done using one of several methods. In a first method, a trench is etched through the top silicon layer 252 at the desired locations. The walls of the trench are then covered with a nitride layer, and the trench is filled with an un-doped polysilicon material. In another method, an aluminum layer is provided over the desired locations. A heat gradient is then applied from the top to bottom. The heat gradient causes the aluminum to migrate into the top silicon layer 252. This forms a p-type material in the locations of the isolation regions 200–206. When the top silicon layer 252 is n-type, a back-to-back diode structure is formed to provide the desired electrical isolation. The aluminum thermal migration approach is preferred, as it is believed that the mechanical integrity of the top silicon layer may not be as compromised.

Figure 8A:
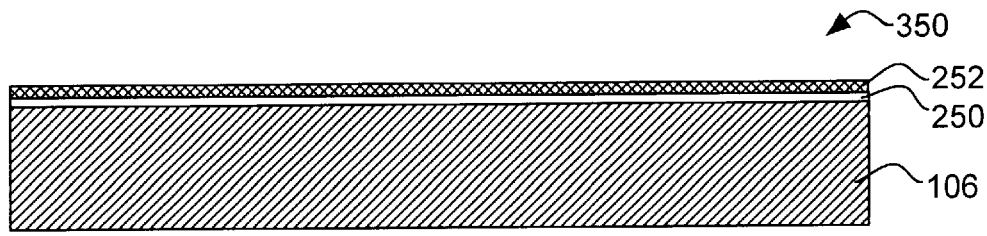
FIGS. 8A–8E show an illustrative method for fabricating a micro-positioning system of the present invention.
Figure 8B:
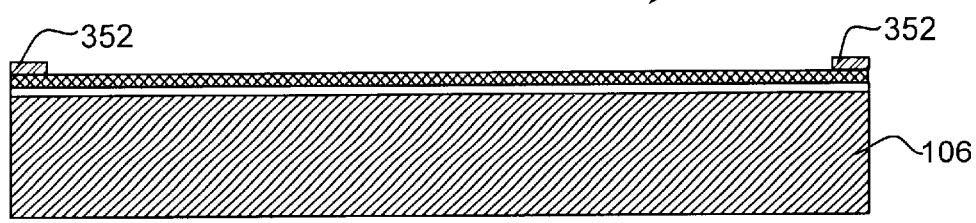

Once the isolation regions 200–206 are formed, and as shown in FIG. 8B, the metal interconnect traces discussed above with respect to FIG. 5 are deposited and patterned. Illustrative metal layers are shown at 352. Thereafter, a diffraction grating is provided and patterned in the region of the optical element 102. Rather than providing a separate layer, the diffraction grating may be formed by etching spaced channels into the top silicon layer 252. Preferably, the diffraction grating is patterned to provide a different grating width and/or grating spacing in different regions of the optical element.

Figure 8C:
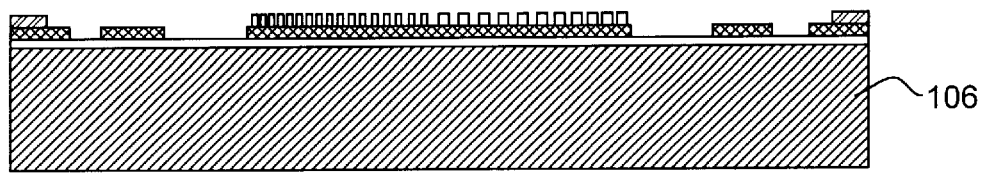

Once the diffraction grating is formed, and as shown in FIG. 8C, the top silicon layer 252 is patterned to form the serpentine springs 110*a*–110*d*, carrier 104, serpentine springs 130*a*–130*d*, top and bottom support bridges 136 and 140, and in some cases the optical element 102.

Figure 8D:
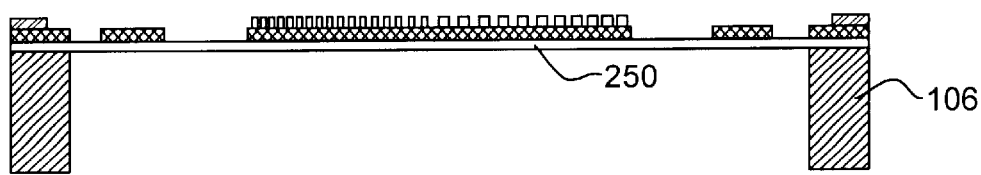
Figure 8E:
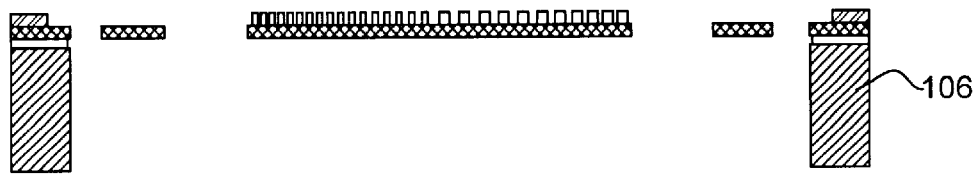

Next, and as shown in FIG. 8D, a hole is etched from the back of the SOI wafer 350 through the substrate or base layer 106. The etch preferably stops at the oxide layer 250. Next, and as shown in FIG. 8E, the oxide layer is removed to release the structure. While the optical element shown in FIGS. 8A–8E includes a diffraction grating, it is contemplated that the optical element may alternatively be a lens or any other type of optical element.

FIGS. 9A–9E show another illustrative method for fabricating a micro-positioning system of the present invention. Again, the illustrative starting material is an SOI silicon wafer, generally shown at 450. The SOI wafer 450 has a silicon substrate or base 106, a thin oxide layer 250 topped with a top silicon layer 252.

Figure 9A:
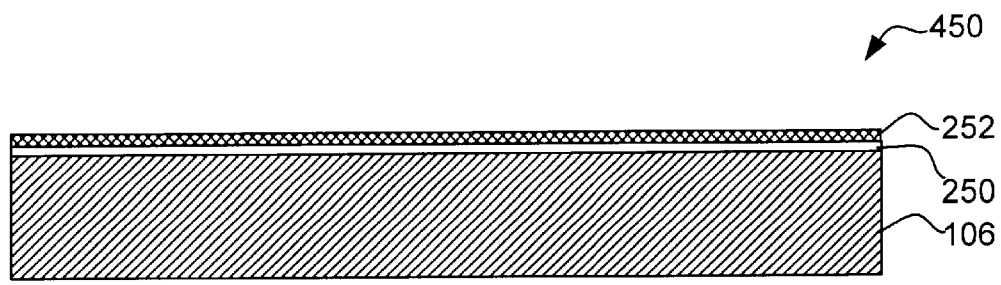
FIGS. 9A–9E show another illustrative method for fabricating a micro-positioning system of the present invention.
Figure 9B:
Figure 9C:
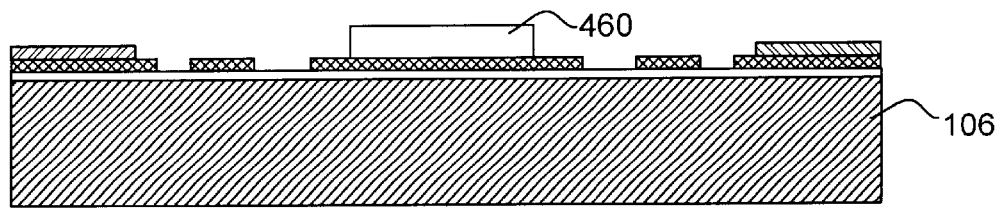
Figure 9D:
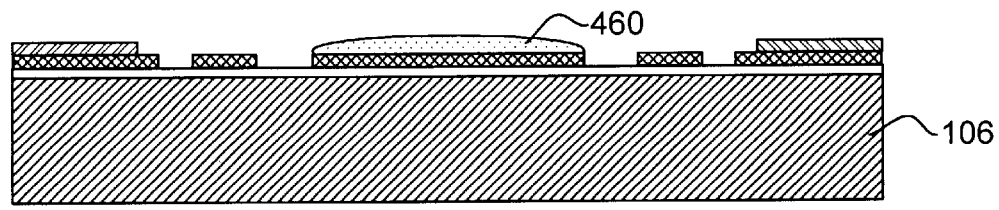

Isolation members 200–206 (see FIG. 5) are then preferably formed, as described above. Once the isolation regions 200–206 are formed, and as shown in FIG. 9B, the metal interconnect traces are deposited and patterned. Illustrative metal layers are shown at 452. Thereafter, and as shown in FIG. 8C, the top silicon layer 252 is patterned to form the serpentine springs 110a–110d, carrier 104, serpentine springs 130a–130d, and top and bottom support bridges 136 and 140. To form the optical element, or in this case a polymer lens, a polymer layer 460 is provided in the location of the optical element. Next, heat is applied to reflow the polymer layer 460 to form the lens, as shown in FIG. 9D.

Figure 9E:
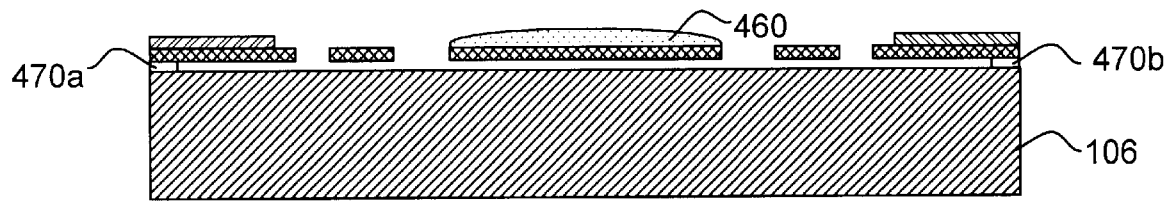

Next, and as shown in FIG. 9E, the oxide layer 252 is etched away to release the structure. Preferably, the oxide etch is applied for a sufficient time to remove the oxide layer under the lens 460 and the remaining structure. The oxide layer preferably remains around the periphery of the structure, as shown at 470a and 470b.

The methods shown in FIGS. 8A–8E and 9A–9E are only illustrative. Other methods for forming the micro-positioning system of the present invention are contemplated. Further, it is contemplated that the diffraction grating of FIGS. 8A–8E may be replaced with the lens 460 of FIGS. 9A–9E, and the lens 460 of FIGS. 9A–9E may be replaced with the diffraction grating of FIGS. 8A–8E.

Having thus described the preferred embodiments of the present invention, those of skill in the art will readily appreciate that the teachings found herein may be applied to yet other embodiments within the scope of the claims hereto attached.

What is claimed is:

1. An apparatus for selectively moving an optical element independently in both the X and Y directions relative to a base, the apparatus comprising:
    a carrier spaced above the base, the carrier being operatively coupled to the base such that the carrier can be selectively moved in the X direction relative to the base but not substantially in the Y direction; and
    the optical element being operatively coupled to the carrier such that the optical element can be selectively moved in the Y direction relative to the carrier but not substantially in the X direction.

2. The apparatus of claim 1 further comprising:
    an X driver for providing the necessary force to selectively move the carrier in the X direction relative to the base; and
    a Y driver for providing the necessary force to selectively move the optical element in the Y direction relative to the carrier.

3. The apparatus of claim 2, wherein the X driver provides an electrostatic force between base and the carrier.

4. The apparatus of claim 3, wherein the X driver includes a number of inter-digitated comb fingers, some of the fingers being mechanically coupled to the carrier and others mechanically coupled to the base, the X driver providing a voltage difference between the fingers coupled to the carrier and the fingers coupled to the base.

5. The apparatus of claim 2, wherein the Y driver provides an electrostatic force between the optical element and the carrier.

6. The apparatus of claim 5, wherein the Y driver includes a number of inter-digitated comb fingers, some of the fingers being mechanically coupled to the carrier and others mechanically coupled to the optical element, the Y driver providing a voltage difference between the fingers coupled to the carrier and the fingers coupled to the optical element.

7. The apparatus of claim 1, wherein the carrier is operatively coupled to the base by one or more serpentine springs that allow the carrier to be moved in the X direction relative to the base but not substantially in the Y direction.

8. The apparatus of claim 1, wherein the optical element is coupled to the carrier by one or more serpentine springs that allow the optical element to be moved in the Y direction relative to the carrier but not substantially in the X direction.

9. The apparatus of claim 1, wherein the optical element is a optical polarizer.

10. The apparatus of claim 1, wherein the optical element is a lens.

11. The apparatus of claim 10, wherein the lens is a diffractive lens.

12. The apparatus of claim 10, wherein the lens is a refractive lens.

13. The apparatus of claim 1, wherein the optical element is an optical filter.

14. The apparatus of claim 1, wherein the optical element includes a diffraction grating.

15. The apparatus of claim 14, wherein the diffraction grating has a grating spacing and a grating width, the grating spacing and/or grating width being different in at least two regions of the optical element.

16. The apparatus of claim 14, wherein the diffraction grating is disposed at different angles in at least two regions of the optical element.

17. An optical system, comprising:
    an optical device for producing or receiving light rays;
    a base disposed adjacent the optical device and fixed in position relative to the optical device;
    a carrier spaced from the base, the carrier being operatively coupled to the base such that the carrier can be selectively moved in a X direction relative to the base but not substantially in a Y direction; and
    an optical element operatively coupled to the carrier such that the optical element can be selectively moved in the Y direction relative to the carrier but not substantially in the X direction, the optical element having optical characteristics such that at least some of the light rays that are produced or received by the optical device are transmitted therethrough.

18. The optical system of claim 17, wherein the optical element has at least two regions, and the optical characteristics of the optical element are different in the at least two regions.

19. The optical system of claim 17, wherein the optical element diffracts the light rays that are produced or received by the optical device.

20. The optical system of claim 17, wherein the optical element refracts the light rays that are produced or received by the optical device.

21. The optical system of claim 17, wherein the optical element filters the light rays that are produced or received by the optical device.

22. The optical system of claim 17, wherein the optical element polarizes the light rays that are produced or received by the optical device.

23. An optical system comprising:
    an optical source or receiver for providing or receiving a light beam;
    an optical element positioned to intersect the light beam, the optical element having a first region and a second region, the first region having a first grating with a first grating spacing and a first grating width, and the second region having a second grating with a second grating spacing and a second grating width; and a driver for selectively moving the optical element in at least one direction so that the light beam selectively intersects the first region or the second region.

24. An optical system according to claim 23, wherein the driver includes:

an X driver for selectively moving the optical element in an X direction; and a Y driver for selectively moving the optical element in a Y direction.

25. An optical system according to claim 24, wherein the X driver and the Y driver can independently move the optical element.

26. An optical system according to claim 24, wherein the X driver moves the optical element using an electrostatic force.

27. An optical system according to claim 26, wherein the Y driver moves the optical element using an electrostatic force.

28. An optical system comprising:

an array of optical sources or receivers;

an array of optical elements, each optical element positioned in the path of light of a corresponding optical source or receiver, each optical element having a first region with a first filter characteristic and a second region with a second filter characteristic; and one or more drivers to move selected optical elements so that the corresponding path of light intersects the first region of the selected optical elements to provide the first filter characteristic, and for moving selected other optical elements so that the corresponding path of light intersects the second region of the selected other optical elements to provide the second filter characteristic.

29. An optical system as in claim 28, wherein the first region of each optical element has a diffraction grating with a first grating width and first grating spacing.

30. An optical system as in claim 28, wherein the second region of each optical element has a diffraction grating with a second grating width and second grating spacing.

31. An optical system as in claim 28, wherein the first region of each optical element has a first polarization direction, and the second region of each optical element has a second polarization direction.

32. A method for filtering light from an optical source, comprising:

providing an optical element in the path of light provided by the optical source, the optical element having a first region with a first filter characteristic and a second region with a second filter characteristic; and moving the optical element so that the path of light intersects the first region of the optical element to provide the first filter characteristic.

33. A method according to claim 32, further comprising the step of:

moving the optical element so that the path of light intersects the second region of the optical element to provide the second filter characteristic.

34. A method according to claim 32, wherein the first region of the optical element has a diffraction grating with a first grating width and first grating spacing.

35. A method according to claim 34, wherein the second region of the optical element has a diffraction grating with a second grating width and second grating spacing.

36. A method according to claim 32, wherein the first region of the optical element has a first polarization direction and the second region of the optical element has a second polarization direction.

37. A method for forming a movable optical element comprising:

providing a starting material with a substrate, an oxide layer and a top layer;

selectively etching the top layer to leave one or more suspended elements of the movable optical element, using the oxide layer of the starting material as an etch stop; and etching the oxide layer sufficient to release the one or more suspended elements of the movable optical element.

38. The method of claim 37, further comprising selectively etching a hole in the substrate of the starting material below the one or more suspended elements using the oxide layer of the starting material as an etch stop before the oxide layer is etched.

39. The method of claim 37, further comprising the step of patterning a metal layer on the top layer to form desired electrical interconnections.

40. The method of claim 39, wherein the patterned metal layer step is provided before the top layer is selectively etched.

41. The method of claim 37, further comprising the step of providing one or more materials at selected locations to form an optical element.

42. The method of claim 41, further comprising the step of reflowing the one or more materials to form a lens.

43. The method of claim 41, wherein the one or more materials include polymers.

44. The method of claim 41, wherein the one or more materials form a diffraction grating.

* * * * *